United States Patent [19]

Baba et al.

[11] Patent Number: 5,053,249

[45] Date of Patent: Oct. 1, 1991

[54] METHOD FOR PRODUCING RESISTORS

[75] Inventors: Kazuo Baba; Yoshiyuki Shiratsuki; Kumiko Takahashi, all of Kanagawa, Japan

[73] Assignee: Fuji Xerox Co., Ltd., Tokyo, Japan

[21] Appl. No.: 415,389

[22] Filed: Sep. 28, 1989

Related U.S. Application Data

[63] Continuation-in-part of Ser. No. 186,102, Apr. 25, 1988, abandoned.

[30] Foreign Application Priority Data

Apr. 28, 1987 [JP] Japan ................................ 62-106072
Feb. 29, 1988 [JP] Japan ................................ 63-46405

[51] Int. Cl.$^5$ ......................... B05D 5/12; B05D 3/02
[52] U.S. Cl. .................................... 427/101; 427/226; 427/126.3; 427/126.5; 427/126.2; 427/126.1
[58] Field of Search ............ 427/101, 102, 226, 126.5, 427/126.3, 126.2, 272, 126.1; 252/521, 518; 338/21, 22 R, 308, 314

[56] References Cited

U.S. PATENT DOCUMENTS 4,292,347 9/1981 Donley ................................ 427/168
4,548,742 10/1985 Hormadaly ........................ 252/519
4,574,292 3/1986 Takikawa et al. ............. 346/76 PH

FOREIGN PATENT DOCUMENTS

SU1084273A 7/1984 United Kingdom .

OTHER PUBLICATIONS

Vest et al, "Synthesis of Metallo-Organic Compounds for MOD Powders and Films", MRS Symposium (Boston, MA) Dec. 1985, pp. 1–10.

Primary Examiner—Shrive Beck
Assistant Examiner—Roy V. King
Attorney, Agent, or Firm—Finnegan, Henderson, Farabow, Garrett, and Dunner

[57] ABSTRACT

A method for producing a resistor is disclosed, comprising coating a metal organic compound solution containing a ruthenium complex and at least one complex of an element selected from the group consisting of silicon, barium, bismuth and lead on a substrate and then firing it. This resistor is a uniform thin-film resistor and is suitable for use as a resistor to be used in hybrid ICs and various electronic devices.

8 Claims, 3 Drawing Sheets

METHOD FOR PRODUCING RESISTORS

This application is a continuation-in-part of application Ser. No. 07/186,102 filed Apr. 25, 1988, now abandoned.

FIELD OF THE INVENTION

The present invention relates to a method for producing resistors to be used in hybrid ICs and various electronic apparatuses, and more particularly, to a method for producing uniform thin film resistors by a thick-film system.

BACKGROUND OF THE INVENTION

As a method for producing resistors to be used in hybrid ICs and electronic apparatuses such as a thermal head, the thick-film system in which a resistor paste is coated on a substrate and then fired to produce a resistor, and a thin-film system using, for example, sputtering have heretofore been known, the former being described, for example, in Tobita et al., *Proc. 1985 International Symposium on Microelectronics*, entitled "Advanced Thick-film Techniques Applied for A New Thermal Printing Head", pp. 494–499, and Vest el al., *Proc. 1983 International Symposium on Microelectronics*, entitled "A General Gold Conductor From Metallo-Organic Compounds", pp. 62–68.

In accordance with the former method, a resistor paste prepared by dispersing a powdery mixture of ruthenium oxide and glass frit in an organic vehicle composed of a solvent and a resin is screen-printed on a substrate and then fired to produce a resistor.

The latter method utilizes vacuum technology. For example, a thin film of sparingly soluble metal such as tantalum is vacuum-deposited on a substrate by sputtering and a pattern is formed by the application of photolitho technique to produce a thin-film resistor. This thin-film resistor is used as a resistor for thermal heads.

Although the thick-film system using the conventional resistor paste has advantages in that the costs for the equipment for production of resistors are low and productivity is high, it suffers from disadvantages that the film thickness of resistors produced is as high as about 10 μm or more, and since the thick film paste is a non-uniform mixture of glass first and ruthenium oxide powders, the strength against electric field is low, that is, when the voltage is changed, the resistance changes abruptly at a certain value. Further, the resistance of a resistor produced is difficult to control only by changing the ratio of glass powder to ruthenium oxide. The resistance greatly changes depending on a difference in particle diameter between glass powder and ruthenium oxide, and a firing temperature. Furthermore, even though the ratio and the average particle diameter are made equal in each lot, the resistance varies depending on the lot.

The latter thin-film system has problems that the equipment is expensive and productivity is low, although a uniform thin film resistor can be obtained.

SUMMARY OF THE INVENTION

An object of the present invention is to provide a method for producing uniform thin film resistors by the thick-film system, and yet free from the above problems.

It has been found that the object can be attained by a method comprising coating a metal organic compound solution containing a ruthenium complex and at least one complex of a metal (M) selected from the group consisting of silicon, barium, bismuth and lead on a substrate, and then firing the coated solution.

DETAILED DESCRIPTION OF THE INVENTION

Figure 1:
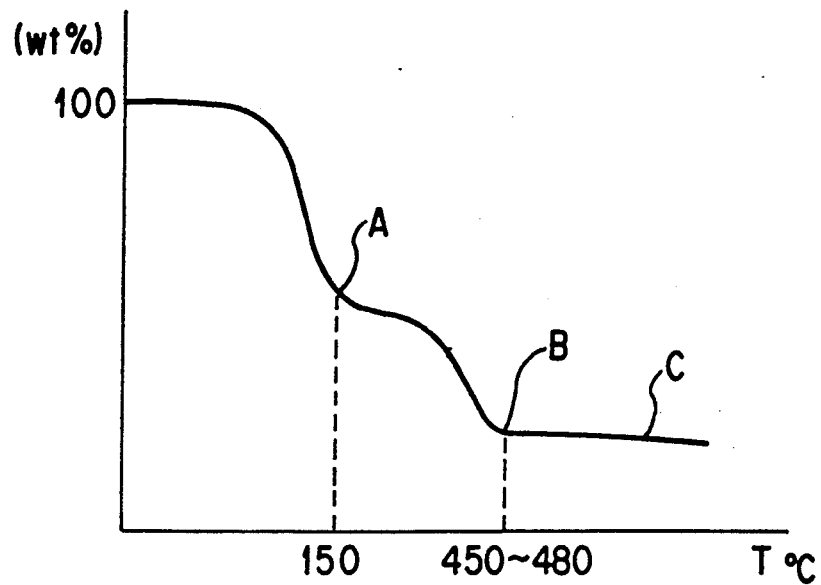
FIG. 1 is a thermogravimetric analysis curve of a resistor paste.

The metal organic compound solution used in the present invention contains, other than a ruthenium complex, at least one complex of a metal (M) selected from silicon, barium, bismuth and lead. Of these metals (M), silicon and bismuth are particularly preferably used in combination.

The metal organic compounds of the present invention are commercially available in the form of solution, for example, various Metal Resinates (trade name, manufactured by Engelhard Co., Ltd.) such as A-1124 (Ru organic compound), #137-C (Ba organic compound), #8365 (Bi organic compound), #28-FC (Si organic compound) and #207-A (Pb organic compound). The present invention, however, is not limited thereto, and various complexes of the metals with organic compounds such as carboxylic acids, mercaptides, oxines, imidazoles, tropolones and β-diketones, can be used as the metal organic compound as long as they are soluble in an organic solvent such as α-terpineol, butylcarbitolacetate, xylene, benzyl alcohol and the like.

Preferred examples of the ruthenium complex used in the present invention include:
(i) complexes with carboxylic acids, represented by formulae (Ia) and (Ib)

$$Ru_2(R^1COO)_4 \qquad (Ia)$$

$$Ru(R^1COO)_3 \qquad (Ib)$$

wherein each of $R^1$s may be the same or different and represents an alkyl group preferably having from 4 to 18 carbon atoms (e.g., heptyl) and an aralkyl group (e.g., benzyl);

(ii) ruthenium mercaptides represented by formulae (Ic), (Id) and (Ie)

$$Ru(SR^2)_4 \qquad (Ic)$$

$$Ru(SR^2)_3 \qquad (Id)$$

$$RuCl(SR^2)_3 \qquad (Ie)$$

wherein each of R²s may be the same or different and represents an aromatic hydrocarbon group preferably having from 7 to 9 carbon atoms and having a benzene ring, and an aliphatic hydrocarbon group such as an alkyl group having from 4 to 20 carbon atoms and preferably from 7 to 9 atoms;

(iii) complexes with oxines such as Ru(C₉H₆NO)₃ and Ru(C₉H₆NS)₃;

(iv) complexes with β-diketones, represented by formula (If)

$$Ru(R^3COCH_2COR^4)_3 \tag{If}$$

wherein each of R³s and R⁴s may be the same or different and represents an aryl group and an alkyl group.

Examples of the metal (M) complexes which can be used in the present invention include those represented by formulae (II) to (V):

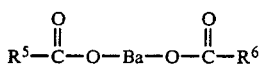
(II)

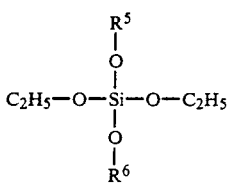
(III)

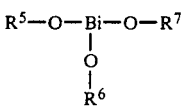
(IV)

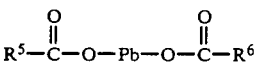
(V)

wherein R⁵, R⁶ and R⁷ which may be the same or different, each represents a hydrocarbon group such as aromatic hydrocarbon groups and aliphatic hydrocarbon groups, e.g., $C_nH_{2n+1}$ wherein n is an integer of from 4 to 20.

The atomic ratio of the metal (M) to Ru contained in the metal organic compound solution is preferably from 0.5/1 to 2.5/1 and more preferably from 1/1 to 1.5/1. If the ratio is less than 0.5/1, an adhesion between the resulting resistor film and the substrate tends to be deteriorated, whereas the ratio of more than 2.5/1 results in increase of the resistance to more than $10^6$ Ω which is not desirable in use as an exothermic resistor.

It is preferred that the metal organic compound solution further contain at least one complex of a metal (M') selected from calcium, aluminium, titanium, zirconium, boron and tin, with zirconium and tin being particularly preferred. By the introduction of the third metal (M') a resistor having an increased resistance and more improved surface properties with minimized cracks can be obtained.

The organic compounds of the metal (M') used in the preferred embodiment are also available under the trade name Metal Resinates 40B (Ca organic compound), A3808 (Al organic compound), #118B (Sn organic compound), #9428 (Ti organic compound), #5437 (Zr organic compound) and #11-A (B organic compound). Further, they may also be complexes as represented by formulae (VI) to (XI):

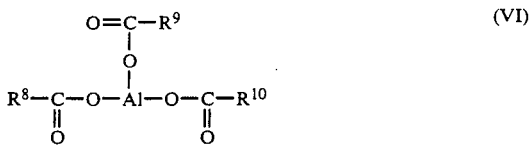
(VI)

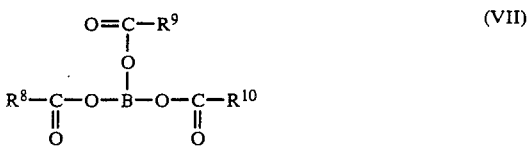
(VII)

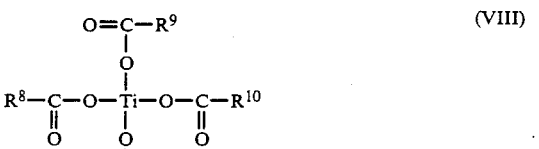
(VIII)

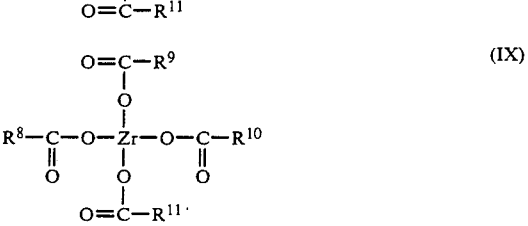
(IX)

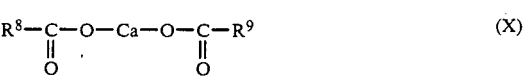
(X)

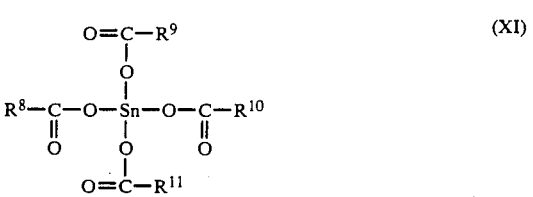
(XI)

wherein R⁸, R⁹, R¹⁰ and R₁₁ which may be the same or different, each has the same meaning as R⁵, R⁶ and R⁷ described above.

The atomic ratio of the total of the metals (M+M') to Ru in the metal organic compound solution of this embodiment is preferably from 0.5/1 to 2.7/1 and more preferably from 1/1 to 1.5/1. When the ratio is more than 2.7/1, the resulting coating tends to agglomerate island-wise upon firing. Further, the atomic ratio of M' to (M+M') generally ranges from 0.05/1 to 0.7/1 while a preferred range thereof varies depending on the kind of the metal (M') (for example, it is about 0.5/1 when the metal (M') is tin).

The metal organic compound solution is generally adjusted to have a viscosity of from 5,000 to 30,000 cps, preferably from 8,000 to 15,000 cps using the aforesaid organic solvent, followed by coating it on a substrate by a conventional method such as screen printing, and then firing the coating to form a resistor. A resistor having a desired shape or pattern (e.g., a pattern of 8 to 24 dot/mm for a thermal head) may also be produced by coating the metal organic compound solution on the entire surface of the substrate by a coating method employed in the thick-film system such as spin coating, roll coating or dip coating, followed by firing the coating and then etching.

The coating on the substrate is generally fired in air at a peak temperature of 500° C. or higher, preferably of from 600° to 850° C., at which the coated substrate is kept for 5 to 30 minutes and preferably from 10 to 15 minutes. FIG. 1 shows a curve obtained by thermogravimetric analysis of the coating during calcination. According to FIG. 1, it is considered that the reduction in weight in the vicinity of firing temperature of about 150° C. is due to the evaporation of the solvent (FIG. 1, A) and the reduction in weight in the vicinity of about 450° to 480° C. is due to the combustion of the organic compound (FIG. 1, B). It is also considered that at more than about 500° C., there can be obtained a resistor in which each metal organic compound is completely converted into the corresponding oxide (FIG. 1, C).

The thus produced resistor by the present invention contains ruthenium oxide ($RuO_2$) and the other metal oxide(s) (e.g., $SiO_2$, BaO, PbO, CaO, $B_2O_3$, $Al_2O_3$, etc.) and a combined oxide of the metal and ruthenium (e.g., $Bi_2Ru_2O_7$, $BaRuO_3$, etc.), and is homogeneous. The ratio of ruthenium oxide to the other metal oxide to the combined oxide of the metal and ruthenium can be changed by changing the type of the metal organic compound solution used and the firing temperature. Thus the resistance of the resistor can be changed.

The film thickness of the resistor of the present invention is generally from 0.1 to 0.5 $\mu$m and preferably from 0.25 to 0.35 $\mu$m.

The present invention will hereinafter be explained with reference to the following Examples, but the present invention is not limited thereto.

EXAMPLE 1

As the metal organic compound solution, the following Metal Resinates (trade name, manufactured by Engelhard Co., Ltd.) were used in Example 1.
Ru . . . A-1124
Ba . . . #137-C
Bi . . . #8365
Si . . . #28-FC
Pb . . . #207-A Metal Resinates A-1124, #8365 and #28-FC were mixed in such a manner that the atomic number ratio after firing was Ru/Bi/Si=1/0.5/0.5. After the viscosity of the mixture using an organic solvent, the resulting mixture was print-coated on a glazed alumina substrate by the use of a stainless steel screen (100–325 mesh) and dried at 120° C., and then fired at a peak temperature of 800° C. or 500° C. for 10 minutes in an infrared ray belt firing furnace to produce a heat resistor film on the substrate (Samples (I) or (I'), respectively).

The film thickness of the resistors thus formed was 0.1 to 0.5 $\mu$m, and the sheet resistance as calculated at a film thickness of 0.35 $\mu$m of Sample (I) was 55 $\Omega/\square$.

For comparison, a conventional ruthenium oxide-based thick film resistor (Sample (II)) was prepared in the same manner as in the preparation of Sample (I) above, except that a dispersion of a powdery mixture of ruthenium oxide and glass frit ("GZ-X" manufactured by Tanaka Massei Co.) in an organic vehicle was used instead of the metal organic compound solution.

Figure 2:
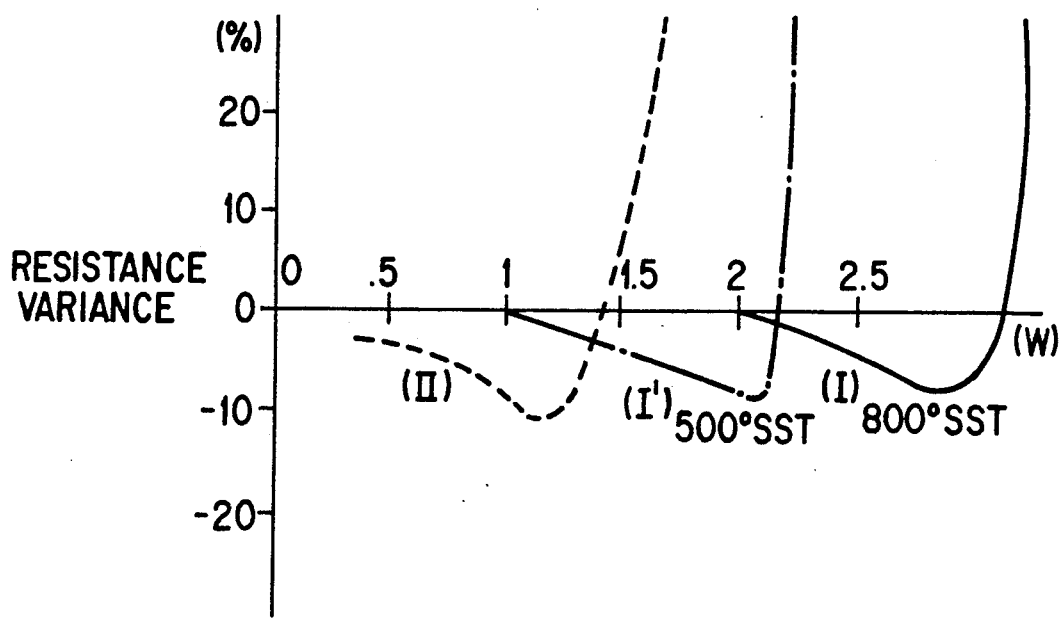
FIG. 2 shows SST strength test results of resistors produced according to the present invention and those produced by the conventional method.

The heat resistor film (Sample (I)) and the heat resistor film (Sample (I')) produced by firing a peak temperature of 800° C. and 500° C., respectively, and the conventional ruthenium oxide-based thick film resistor (Sample (II)) were subjected to a SST strength test. The results are shown in FIG. 2. In FIG. 2, the abscissa axis indicates an electric energy wattage (W), and the ordinate axis indicates a resistance variance (%). For the heat resistors (I) and (I') of the present invention as used in the measurement of FIG. 2, the size was 105 $\mu$m $\times$ 150 $\mu$m, the film thickness was 0.34 $\mu$m and the resistance was 350 $\Omega$. The size of the ruthenium oxide-based thick resistor (II) produced by the conventional method was the same as above, but the film thickness was 15 $\mu$m.

The SST (Step Stress Test) strength test is, as is well known, to examine a resistance variance ratio by changing the electric energy. In FIG. 2, the resistance variance ratio was examined while changing the electric power by way of changing the height of 1 ms-width pulse at intervals of 10 ms, that is, by changing voltage. The resistance variance is calculated from the following equation:

$$\text{Resistance Variance} = \frac{R - R'}{R'} \times 100\%$$

wherein R and R' are resistances after and before applying voltage, respectively.

As apparent from FIG. 2, the heat resistor of the present invention is small in the resistance variance ratio. Particularly in the neighborhood of 1 W as commonly used, almost no change occurs, and the resistor strength markedly increased. This shows that the resistor of the present invention has high reliability.

Figure 3:
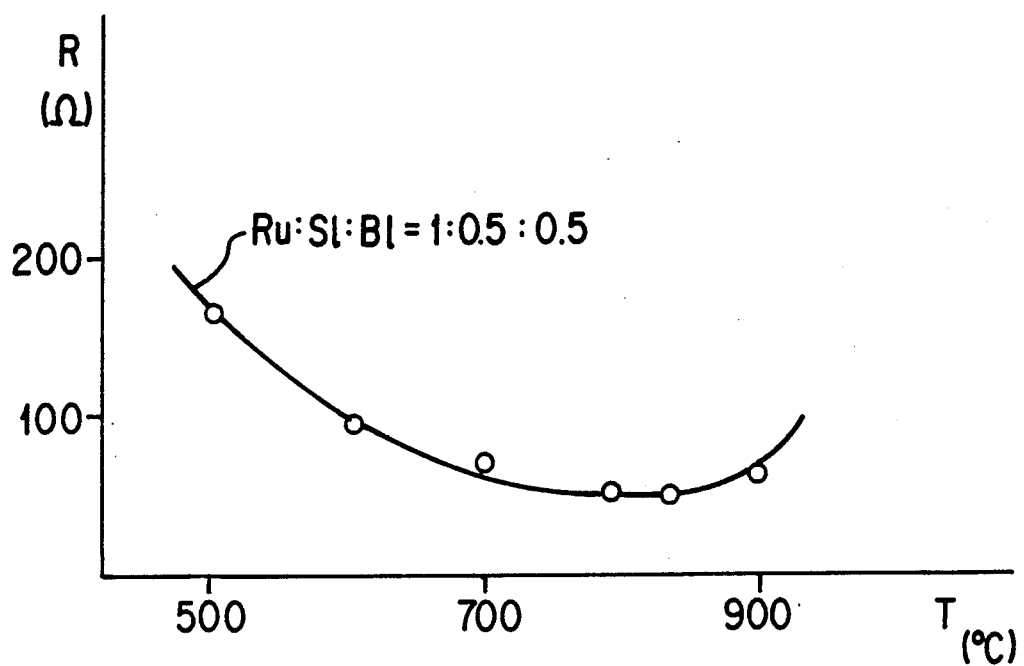
FIG. 3 shows a relation between firing temperature and resistance of a resistor produced by the present invention.
Figure 4:
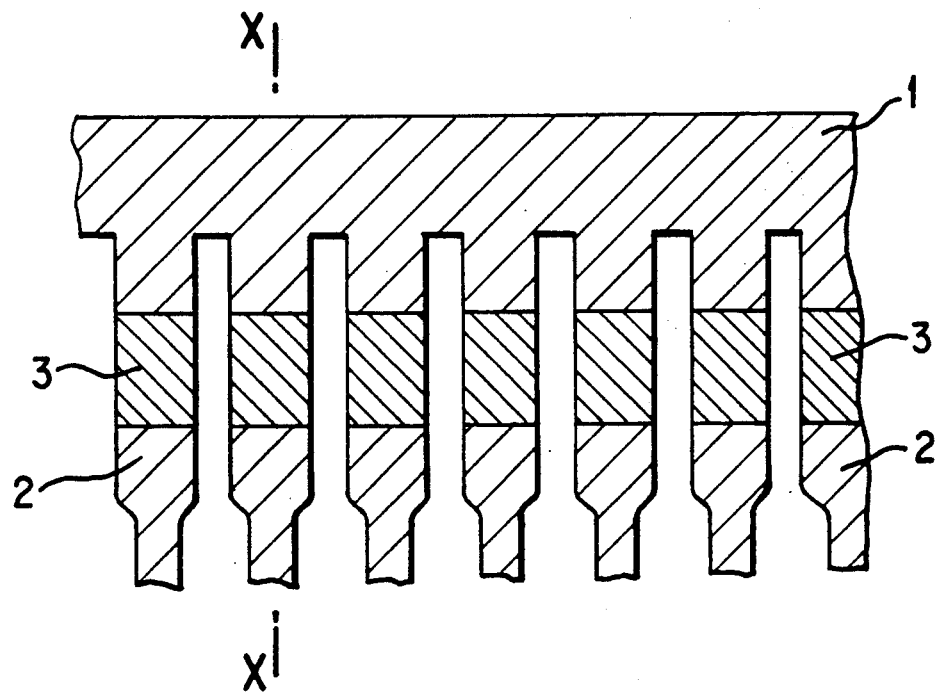
FIG. 4 is a plane view of a primary part of a thermal head utilizing a resistor produced by the present invention.

Further, the same procedures as in the preparation of Sample (I) were repeated except the firing was carried out at various temperatures and resistance was measured. The results are shown in FIG. 3. It is seen from the results that the resistance of the heat resistor varies with the firing temperature.

The same procedures were also repeated to prepare various resistors except changing the composition of the metal organic compound solution to those shown in Table 1, and sheet resistances were measured. The results are shown in Table 1. In this case, the film thickness was 0.35 $\mu$m.

TABLE 1

| Sample | Composition (Atomic Number Ratio) | | | | | Sheet Resistance |
|---|---|---|---|---|---|---|
| | Ru | Si | Bi | Ba | Pb | $\Omega/\square$ |
| A | 1 | 1 | — | — | — | 5 K. |
| B | 1 | 1 | 0.1 | — | — | 2.5 K. |
| C | 1 | 1 | 0.5 | — | — | 65 |
| D* | 1 | 0.5 | 0.5 | — | — | 55 |
| E | 1 | — | — | 1 | — | 30 K. |
| F | 1 | 0.8 | — | 0.2 | — | 7 K. |
| G | 1 | 0.5 | 0.5 | — | 0.5 | 59 |
| H | 1 | 0.5 | — | — | 0.5 | 43 |
| I | 1 | 1.5 | 1 | — | — | 40 K. |
| J | 1 | 0.1 | 0.5 | — | — | 41 |
| K | 1 | 1 | — | — | 0.5 | 83 |

*Sample D is the same as Sample (1) above.

EXAMPLE 2

The metal organic compound solutions having various compositions as shown in Table 2 were prepared using the following Metal Resinates in combination with those used in Example 1.
Ca . . . 40B
Al . . . A3808
Sn . . . #118B
Ti . . . #9428
Zr . . . #5437
B . . . #11-A Each of the metal organic compound solutions was print-coated on a glazed alumina substrate, dried and the fired at a peak temperature of 800° C. for 10 minutes in the same manner as in Example 1, whereby various heat resistors (Samples L to R) were obtained.

Sheet resistances of the resistors were measured and the results are shown in Table 2. In this case, the film thickness was 0.35 μm.

TABLE 2

| Sample | Composition (Atomic Number Ratio) | Sheet Resistance Ω/□ |
| --- | --- | --- |
| L | Ru/Si/Pb/Al = 1/1/1/0.7 | 334 |
| M | Ru/Si/Bi/B = 1/0.5/0.5/0.5 | 63 |
| N | Ru/Si/Bi/Ti = 1/0.5/0.5/0.7 | 425 |
| O | Ru/Si/Bi/Zr = 1/0.5/0.5/0.5 | 379 |
| P | Ru/Si/Pb/Ca = 1/1/1/0.3 | 174 |
| Q | Ru/Si/Pb/Ba = 1/1/1/0.3 | 54 |
| R | Ru/Si/Sn = 1/0.3/0.5 | 439 |

EXAMPLE 3

Figure 5:
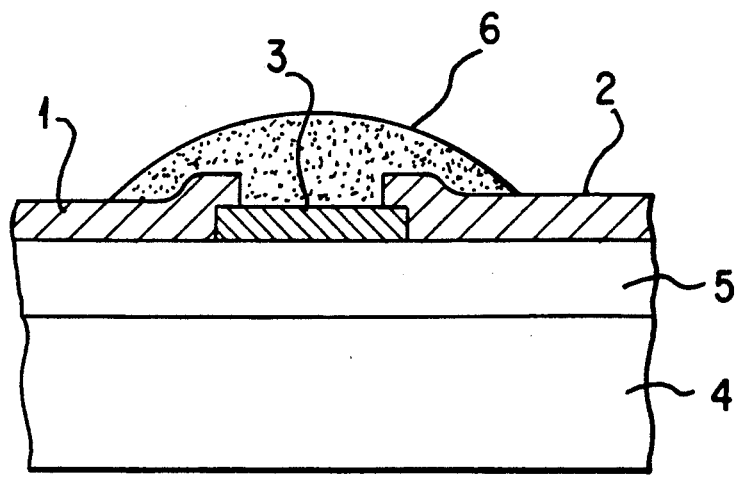
FIG. 5 is a view of the section X-Y of the thermal head shown in FIG. 4.

Using a metal organic compound solution used for Sample N (Ru/Si/Bi/Ti=1/0.5/0.5/0.7) in the same manner as in Example 2, an heat resistor film was formed on a glazed alumina substrate having underglazed layer 5 on alumina substrate 4 as shown in FIG. 5. Then, the resistor film was coated with a photoresist, light-exposed and developed to form a resist pattern, followed by etching the uncovered portion of the resistor film with a fluoronitric acid as an etching solution, whereby a resistor pattern of 12 dot/mm (size 51.3×103.2 μm; relative standard deviation δ=2.8% was formed on the glazed alumina substrate.

Figure 6:
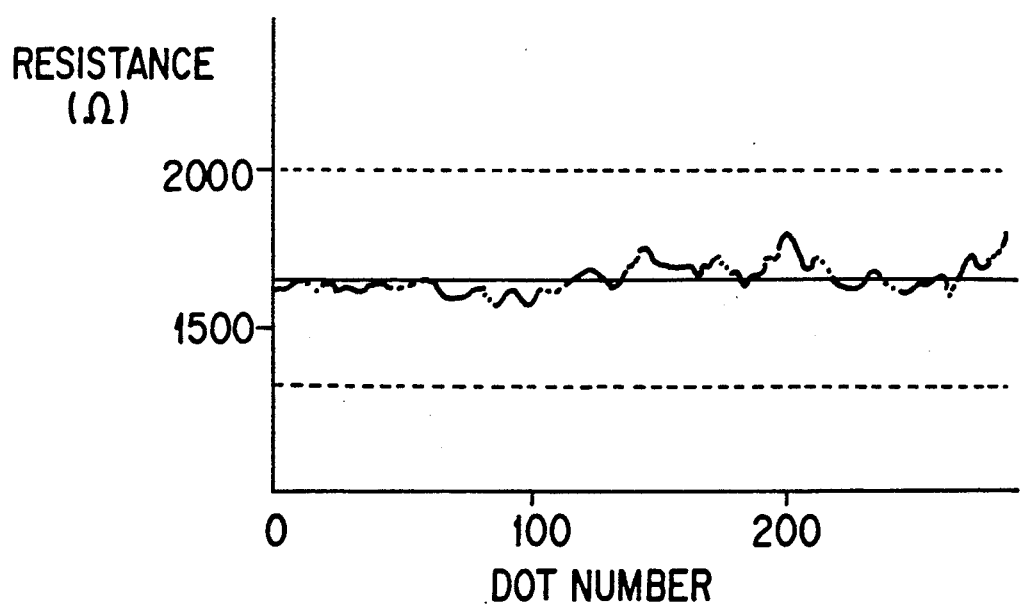
FIG. 6 shows a resistance characteristic of the thermal head produced in Example 3.

On the entire surface of the resistor pattern-formed alumina substrate was coated a metalo-organic gold paste ("D27" manufactured by NORITAKE CO., LTD.), followed by firing to form a gold film. Thereafter, a resist pattern for common electrode 1 and confronting electrode 2 was formed on the gold film by photoresist-coating, light-exposing and developing, and subsequently the uncovered gold film was etched using an iodine-potassium iodide ($I_2 \cdot KI$) solution to form the electrodes. Overglazed layer 6 as shown in FIG. 5 was further formed by printing a glass paste ("4903H" manufactured by Electro-Science Laboratory (ESL)) and firing it. Thus, a thermal head was produced, which exhibited a resistance characteristic as shown in FIG. 6. In FIG. 6, the abscissa axis indicates doe number in line on the thermal head and the ordinate axis indicates resistance (Ω) of the dot of the number. It is seen from FIG. 6 that the dots exhibit substantially a constant resistance regardless of the dot number in the line.

The process of the present invention has the following advantages.

(i) The heat resistor of the present invention can be formed as a uniform and thin film although it can be produced using the same inexpensive equipment as in a thick film resistor using glass frit.

(ii) Controlling the resistance is almost determined by the composition ratio of metals and the firing conditions. Thus it is not necessary to take into consideration the influences of other parameters such as variation according to the lot and so forth.

(iii) Furthermore, there can be obtained a resistor which is small in resistance variance according to electric energy and is of high reliability.

While the invention has been described in detail and with reference to specific embodiments thereof, it will be apparent to one skilled in the art that various changes and modifications can be made therein without departing from the spirit and scope thereof.

What is claimed is:

1. A method of producing a resistor which comprises coating a metal organic compound solution containing a ruthenium complex and at least one complex of an element (M) selected from the group consisting of silicon, barium, bismuth and lead on a substrate and then firing it.

2. A method as claimed in claim 1, wherein the atomic ratio of the element (M) to ruthenium, M/Ru, ranges from 5/1 to 2.5/1.

3. A method as claimed in claim 1, wherein the firing of the metal organic compound solution is carried out at a peak temperature of at least 500° C.

4. A method as claimed in claim 1, wherein said metal organic compound solution further contains at least one complex of an element (M') selected from the group consisting of calcium, aluminum, titanium, zirconium, boron, and tin.

5. A method as claimed in claim 4, wherein the atomic ratio of the total of the elements (M+M') to ruthenium, (M+M')/Ru, ranges from 0.5/1 to 2.7/1.

6. A method as claimed in claim 1, wherein said ruthenium complex is selected from the group consisting of (i) complexes with carboxylic acids, represented by formulae (Ia) and (Ib)

$$Ru_2(R^1COO)_4 \qquad (Ia)$$

$$Ru(R^1COO)_3 \qquad (Ib)$$

wherein each of $R^1$s is the same or different and represents an alkyl group having from 4 to 18 carbon atoms and an aralkyl group;

(ii) ruthenium mercaptides represented by formulae (Ic), (Id) and (Ie)

$$Ru(SR^2)_4 \qquad (Ic)$$

$$Ru(SR^2)_3 \qquad (Id)$$

$$RuCl(SR^2)_3 \qquad (Ie)$$

wherein each of $R^2$s is the same or different and represents an aromatic hydrocarbon group having from 7 to 9 carbon atoms and having a benzene ring, and an alkyl group having from 4 to 20 carbon atoms;

(iii) complexes with oxines selected from $Ru(C_9H_6NO)_3$ and $Ru(C_9H_6NO)_3$; and (iv) complexes with β-diketones, represented by formula (If)

$$Ru(R^3COCH_2COR^4)_3 \qquad (If)$$

wherein each of $R^3$s and $R^4$s is the same or different and represents an aryl group and an alkyl group.

7. A method as claimed in claim 6, wherein said complex of element (M) is selected from the group consisting of formulas (II) to (V).

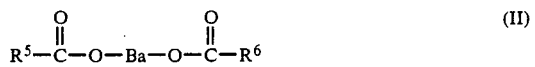

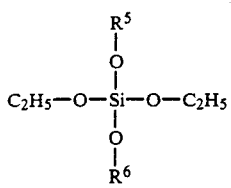 (III)

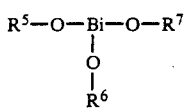 (IV)

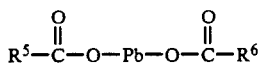 (V)

wherein $R^5$, $R^6$ and $R^7$ which may be the same or different, each represents aromatic hydrocarbon group or aliphatic hydrocarbon group of the formula $C_nH_{2n+1}$, wherein n is an integer of from 4 to 20.

8. A method as claimed in claim 4, wherein said complex of element (M') is selected from the group consisting of formulae (VI) to (XI)

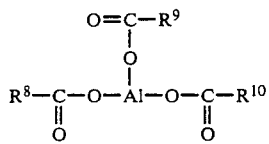 (VI)

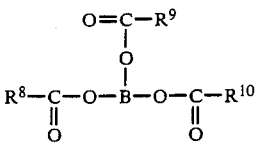 (VII)

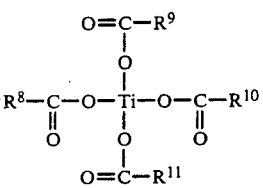 (VIII)

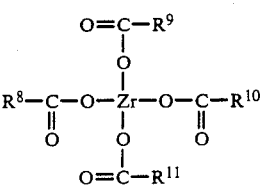 (IX)

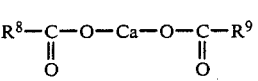 (X)

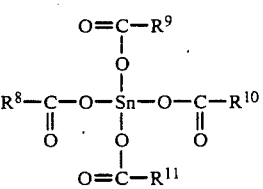 (XI)

in which $R^8$, $R^9$, $R^{10}$ and $R^{11}$ may be the same or different and each represents an aromatic hydrocarbon group or an aliphatic hydrocarbon group of the formula $C_nH_{2n+1}$, wherein n is an integer from 4 to 20.

* * * * *

UNITED STATES PATENT AND TRADEMARK OFFICE
CERTIFICATE OF CORRECTION

PATENT NO. : 5,053,249

DATED : October 1, 1991

INVENTOR(S) : Kazuo Baba et al.

Page 1 of 4

It is certified that error appears in the above-identified patent and that said Letters Patent is hereby corrected as shown below:

On title page, item [54] and col. 1, change "METHOD FOR PRODUCING RESISTORS" to --METHOD OF PRODUCING RESISTORS USING METALORGANIC PRECURSORS--.

Claim 1, column 8, line 5, after "coating" insert --on a substrate--.

Claim 1, column 8, line 8, Delete "on a substrate".

Claim 1, column 8, line 9, change "it." to --it, wherein said ruthenium complex and said at least one complex of an element (M) are selected from carboxylates, oxinates, imidazolates, beta-diketonates, mercaptanes, tropolones and alkoxides.--.

Claim 2, column 8, line 12, change "5/1" to --0.5/1--.

UNITED STATES PATENT AND TRADEMARK OFFICE
CERTIFICATE OF CORRECTION

PATENT NO. : 5,053,249
DATED : October 1, 1991
INVENTOR(S) : Kazuo Baba et al.

It is certified that error appears in the above-identified patent and that said Letters Patent is hereby corrected as shown below:

Claim 6, column 8, line 46, change "each of" to --the--.

Claim 6, column 8, line 47, change "represents" to --are selected from--.

Claim 6, column 8, line 51, change "complexes with oxines" to --oxinates--.

Claim 6, column 8, line 52, after "and" change "$Ru(C_9H_6NO)_3$" to --$Ru(C_9H_6NS)_3$--.

Claim 6, column 8, line 53, change "complexes with $\beta$-diketones," to --beta-diketonates--.

Claim 6, column 8, line 58, change "each of" to --the--.

Claim 6, column 8, line 59, change "represents" to --are selected from--.

UNITED STATES PATENT AND TRADEMARK OFFICE
CERTIFICATE OF CORRECTION

PATENT NO. : 5,053,249

DATED : October 1, 1991

INVENTOR(S) : Kazuo Baba et al.

Page 3 of 4

It is certified that error appears in the above-identified patent and that said Letters Patent is hereby corrected as shown below:

Claim 4, column 8, line 20, change "tin." to --tin, wherein said at least one complex of an element (M') is selected from carboxylates, oxinates, imidazolates, beta-diketonates, mercaptanes, tropolones and alkoxides.--

Claim 6, column 8, line 27, change "complexes with carboxylic acids," to --carboxylates--.

Claim 6, column 8, line 34, change "each of" to --the--.

Claim 6, column 8, line 35, change "represents" to --are selected from--.

UNITED STATES PATENT AND TRADEMARK OFFICE
CERTIFICATE OF CORRECTION

PATENT NO. : 5,053,249
DATED : October 1, 1991
INVENTOR(S) : Kazuo Baba et al.

It is certified that error appears in the above-indentified patent and that said Letters Patent is hereby corrected as shown below:

Claim 6, column 8, line 37, change "ruthenium mercaptides" to -- mercaptanes--

Signed and Sealed this

Fourteenth Day of June, 1994

Attest:

BRUCE LEHMAN

*Attesting Officer*   *Commissioner of Patents and Trademarks*